(12) United States Patent
Kenji

(10) Patent No.: US 10,026,654 B2
(45) Date of Patent: Jul. 17, 2018

(54) CMOS DEVICE WITH DECREASED LEAKAGE CURRENT AND METHOD MAKING SAME

(71) Applicant: HON HAI PRECISION INDUSTRY CO., LTD., New Taipei (TW)

(72) Inventor: Anjo Kenji, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/818,920

(22) Filed: Nov. 21, 2017

(65) Prior Publication Data

US 2018/0076096 A1 Mar. 15, 2018

Related U.S. Application Data

(62) Division of application No. 14/855,626, filed on Sep. 16, 2015, now Pat. No. 9,859,167.

(30) Foreign Application Priority Data

Sep. 8, 2015 (CN) .......................... 2015 1 0564982

(51) Int. Cl.
*H01L 21/8238* (2006.01)
*H01L 27/092* (2006.01)
(Continued)

(52) U.S. Cl.
CPC .. *H01L 21/823807* (2013.01); *H01L 27/0922* (2013.01); *H01L 29/045* (2013.01);
(Continued)

(58) Field of Classification Search
CPC ......... H01L 21/823807; H01L 27/0922; H01L 27/1288; H01L 29/78621; H01L 2029/7863
See application file for complete search history.

(56) References Cited

U.S. PATENT DOCUMENTS 7,071,504 B2 * 7/2006 Kurosawa ............... H01L 27/12
257/291
7,598,526 B2 * 10/2009 Godo .................. H01L 29/66757
257/72

(Continued)

*Primary Examiner* — Stephen Bradley
(74) *Attorney, Agent, or Firm* — ScienBiziP, P.C.

(57) ABSTRACT

A method for making a CMOS device includes: providing a substrate with a semiconductor layer and a photoresist layer; irradiating the photoresist layer through a mask to obtain a first photoresist and a second photoresist having a height smaller than that of the first photoresist; first implanting ions to the semiconductor layer; ashing the first and second photoresists to expose a first region of the semiconductor layer and removing the second photoresist to expose a second region of the semiconductor layer; secondly implanting ions to the semiconductor layer; removing the first photoresist to expose a third region of the semiconductor layer surrounded by the second region; forming a third photoresist and a fourth photoresist on the semiconductor layer; etching the semiconductor layer to remove the semiconductor layer not covered by the third and fourth photoresists; removing the third and fourth photoresists; and thirdly implanting ions to the semiconductor layer.

10 Claims, 14 Drawing Sheets

(51) Int. Cl.
*H01L 29/167* (2006.01)
*H01L 29/16* (2006.01)
*H01L 29/04* (2006.01)
*H01L 29/66* (2006.01)
*H01L 27/12* (2006.01)

(52) U.S. Cl.
CPC ............ *H01L 29/16* (2013.01); *H01L 29/167* (2013.01); *H01L 29/66537* (2013.01); *H01L 27/1288* (2013.01)

(56) References Cited

U.S. PATENT DOCUMENTS

| | | | |
|---|---|---|---|
| 9,006,059 B2* | 4/2015 | Sun | H01L 29/78621 438/166 |
| 2005/0170573 A1* | 8/2005 | Makita | H01L 29/66757 438/166 |
| 2012/0228606 A1* | 9/2012 | Koezuka | H01L 29/7869 257/43 |
| 2012/0305930 A1* | 12/2012 | Makita | H01L 27/1222 257/72 |

* cited by examiner

CMOS DEVICE WITH DECREASED LEAKAGE CURRENT AND METHOD MAKING SAME

CROSS-REFERENCE TO RELATED APPLICATION

This application is a divisional application of U.S. Ser. No. 14/855,626, filed Sep. 16, 2015 the contents of which are hereby incorporated by reference. The patent application Ser. No. 14/855,626 in turn claims the benefit of priority under 35 USC 119 from Chinese Patent Application No. 201510564982.1 filed on Sep. 8, 2015.

FIELD

The subject matter herein generally relates to a complementary metal oxide semiconductor (CMOS) device and a method for manufacturing the CMOS device, and particularly to a CMOS device having decreased leakage current and improved hump phenomenon and a method for manufacturing the CMOS device.

BACKGROUND

CMOS devices are widely used as microprocessors, microcontrollers, random-access memorys (RAMs), high density image sensors and other digital logic circuits. A CMOS device has the advantages of high noise immunity and low static power consumption. However, due to hump phenomenon, concentrations of doped ions to control threshold voltage (Vth) of gate voltage (Vg) of the CMOS device is different between a tapered region and a flat region of a semiconductor layer which can be a poly-Si layer of the CMOS device. The different threshold voltages in different regions of the poly-Si layer of the CMOS device causes the CMOS device to have a high leakage current which is adverse to quality and operations of the CMOS device. Such high leakage current problem is more serious when the CMOS device is made smaller and smaller.

To overcome the high leakage current problem of the CMOS device due to the hump phenomenon, a concentration of ions in a tapered region of a poly-Si layer for an n-channel metal oxide semiconductor (NMOS) of the CMOS device needs to be increased, while the concentration of ions in a tapered region of a poly-Si layer for a p-channel metal oxide semiconductor (PMOS) thereof needs to be kept unchanged. To achieve this, an additional photo process is required during the manufacturing of the CMOS device. Such an additional photo process increases the manufacturing cost of the CMOS device.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
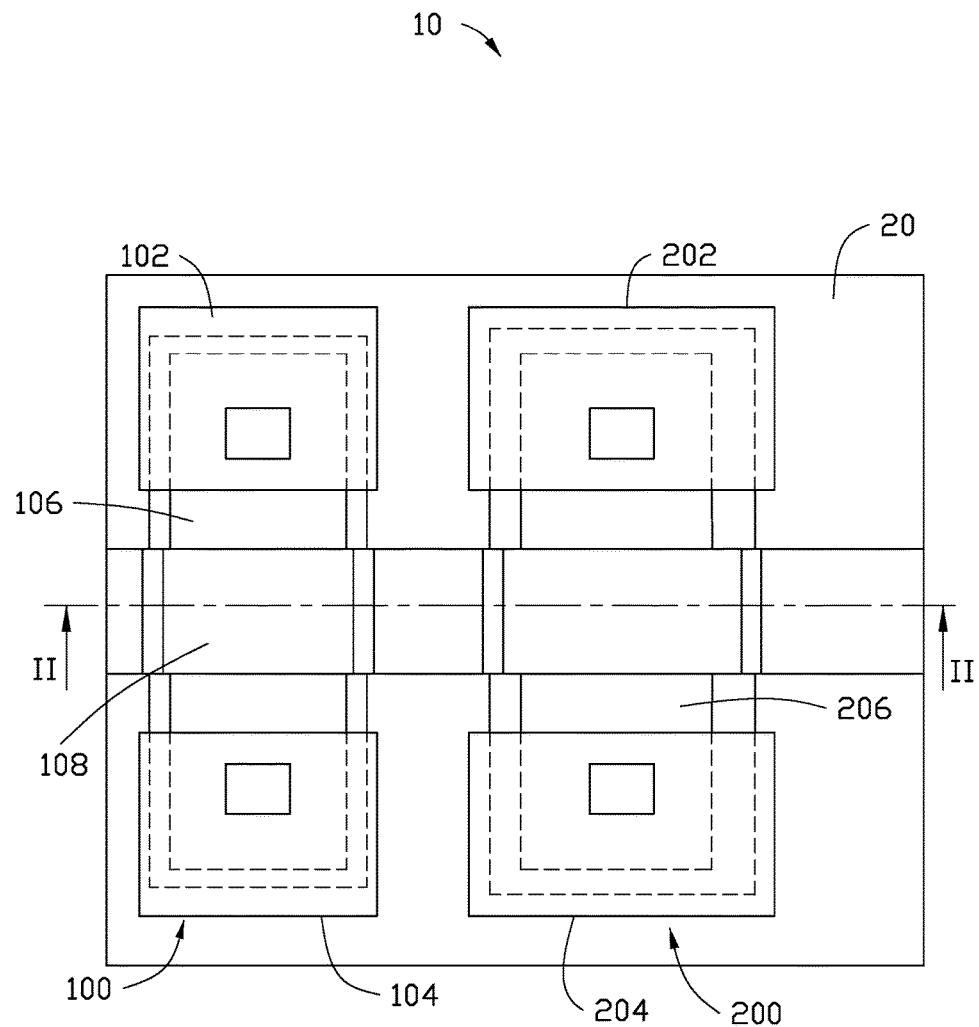
FIG. 1 is a top view of a CMOS device in accordance with a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Referring to FIG. 1, a CMOS device 10 in accordance with a first embodiment of the present disclosure includes a substrate 20 which can be made of glass, a p-channel metal oxide semiconductor (PMOS) transistor unit 100 and an n-channel metal oxide semiconductor (NMOS) transistor unit 200 formed on the substrate 20. The PMOS transistor unit 100 includes a source electrode 102, a drain electrode 104, a semiconductor layer 106 between the source and drain electrodes 102, 104 and a gate electrode 108. The semiconductor layer 106 can be made of polycrystalline silicon (poly-Si) implanted with boron ions. The NMOS transistor unit 200 includes a source electrode 202, a drain electrode 204, a semiconductor layer 206 between the source and drain electrodes 202, 204 and the gate electrode 108.

The semiconductor layer 206 can be made of poly-Si implanted with boron ions. In this embodiment, the gate electrode 108 is formed as an elongated stripe which extends between the source electrodes 102, 202 and the drain electrodes 104, 204, perpendicularly to the semiconductor layers 106, 206 and over the semiconductor layers 106, 206. By applying a bias to the gate electrode 108, operations of both of the PMOS and NMOS transistor units 100, 200 can be controlled.

Figure 2:
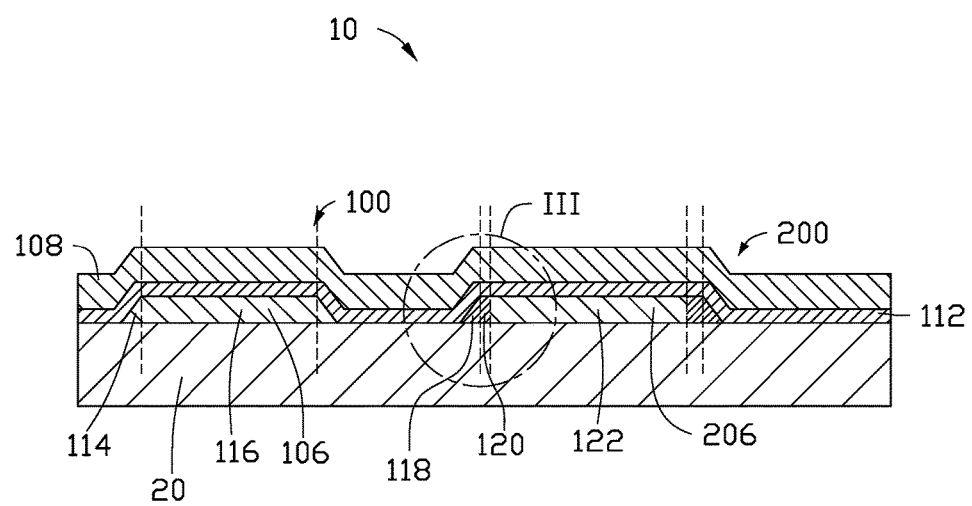
FIG. 2 is a cross-sectional view of the CMOS device of FIG. 1, taken along line II-II thereof.

Referring to FIG. 2, the CMOS device 10 of FIG. 1 further includes a gate insulator 112 formed on the substrate 20, below the gate electrode 108 and covering the semiconductor layers 106, 206 to electrically insulate the semiconductor layers 106, 206 from the gate electrode 108.

Figure 3:
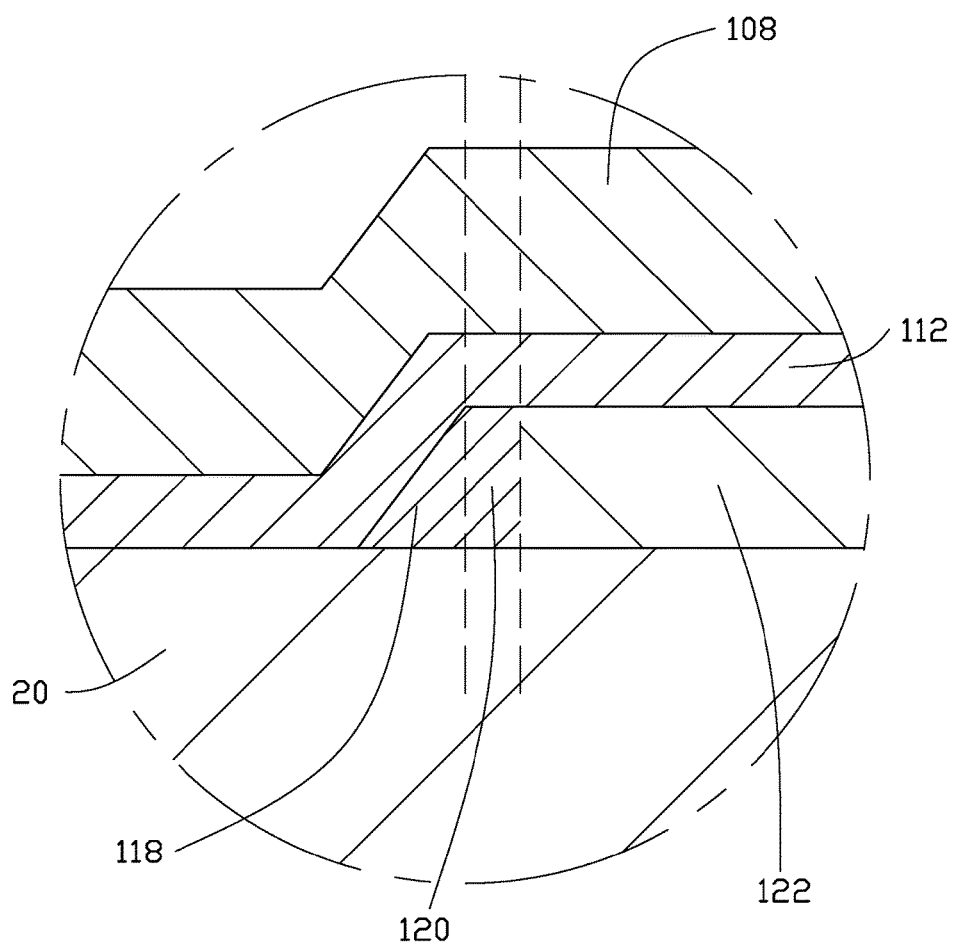
FIG. 3 is an enlarged view of a circled portion III of FIG. 2.

Also referring to FIG. 3, the semiconductor layers 106, 206 in accordance with the present disclosure can be divided into five regions 114, 116, 118, 120, 122. The region 114 is a tapered region for the semiconductor layer 106. The region 116 is a flat region for the semiconductor layer 106. The region 118 is a tapered region for the semiconductor layer 206. The region 120 is a peripheral portion of a flat region for the semiconductor layer 206. The region 122 is a main portion of the flat region of the semiconductor layer 206. Concentrations of ions implanted in these regions 114, 116, 118, 120, 122 are different wherein CP/e represents the concentration in the region 114, CP/f represents the concentration in the region 116, CN/e represents the concentration in the region 118, CN/f-1 represents the concentration in the region 120 and CN/f-2 represents the concentration in the region 122. These concentrations CP/e, CP/f, CN/e, CN/f-1, CN/f-2 have the following relationship: $CP/e<CP/f<CN/f-2<CN/e<CN/f-1$. By such design, the hump phenomena on both the PMOS and NMOS transistor units 100, 200 can be disappeared. The threshold voltage at the tapered region of the semiconductor layer 206 of the NMOS transistor unit 200 can be increased while the threshold voltage at the tapered region of the semiconductor layer 106 of the PMOS transistor unit 100 is not decreased. Accordingly, the leakage current of the CMOS device 10 in accordance with the present disclosure can be lowered.

Figure 4:
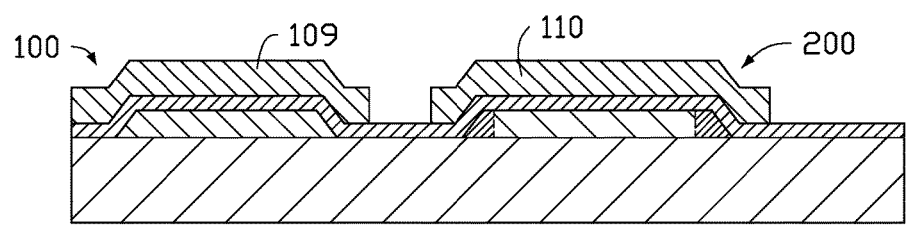
FIG. 4 is a cross-sectional view of a CMOS device in accordance with a second embodiment of the present disclosure.

FIG. 4 shows a CMOS device in accordance with an alternative embodiment of the present disclosure, which is substantially the same as the first embodiment. The difference is that, as shown in FIG. 4, there are two separated gate electrodes 109, 110 each being formed for controlling an operation of a respective one of the PMOS and NMOS transistor units 100, 200.

Figure 5:
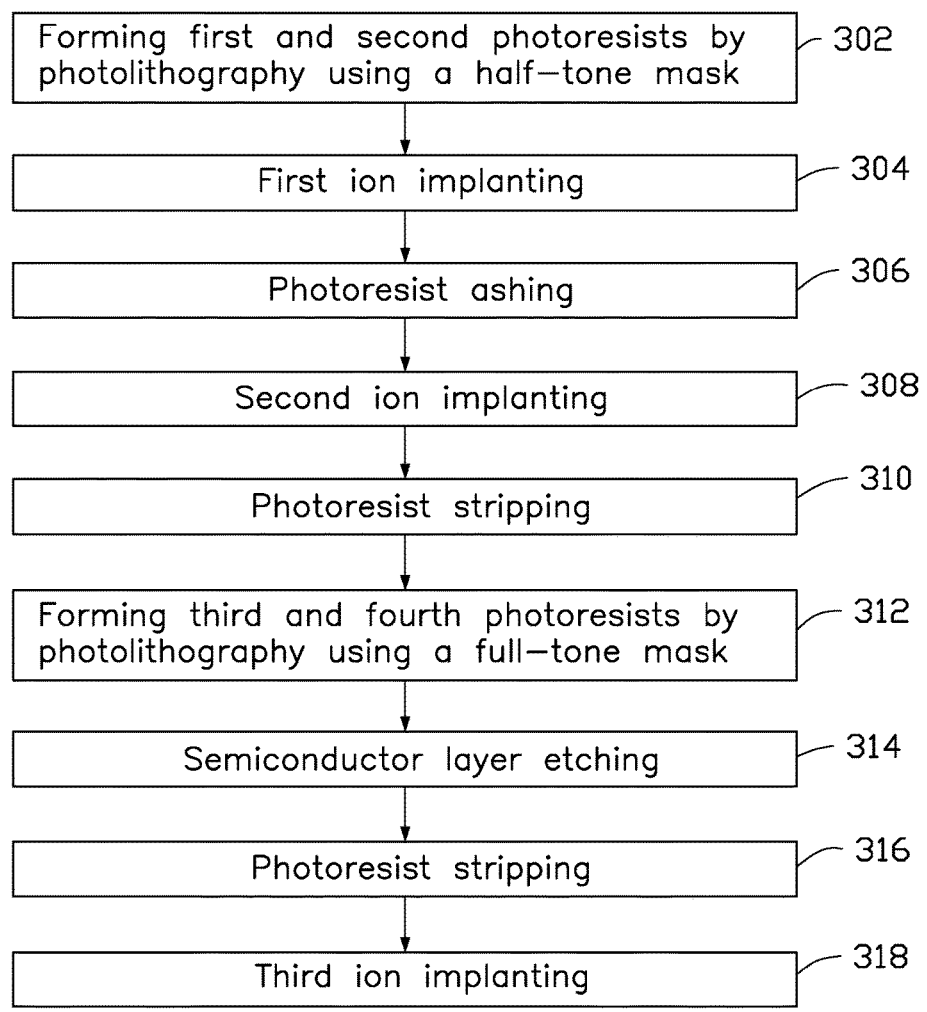
FIG. 5 is a flowchart showing a method for manufacturing a CMOS device in accordance with the present disclosure.

Referring to FIG. 5, a flowchart is presented in accordance with an example embodiment. The example method 300 is provided by way of example, as there are a variety of ways to carry out the method. The method 300 described below can be carried out using the configurations illustrated in FIGS. 1-4 and 6-13, for example, and various elements of these figures are referenced in explaining example method 300. Each block shown in FIG. 5 represents one or more processes, methods or subroutines, carried out in the example method 300. Furthermore, the illustrated order of blocks is illustrative only and the order of the blocks can change according to the present disclosure. Additional blocks can be added or fewer blocks may be utilized, without departing from this disclosure. The example method 300 can begin at block 302.

Figure 6:
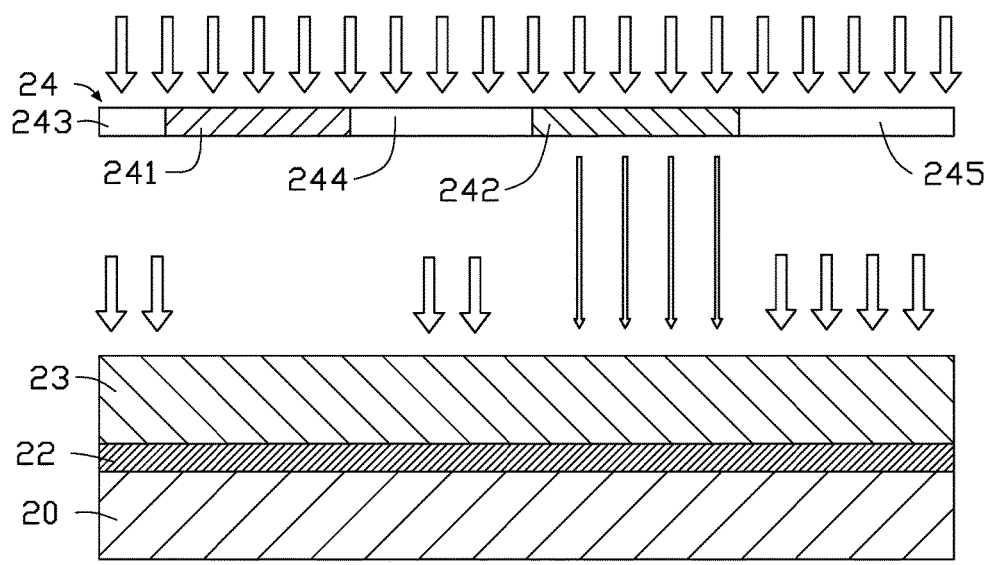
FIG. 6 is a cross-sectional view showing a photolithographic process of the method of FIG. 5.

At block 302, also referring to FIG. 6, a substrate 20 with a poly-Si layer 22 formed thereon is provided. A photoresist layer 23 is provided on the poly-Si layer 22. A half-tone mask 24 is provided over the photoresist layer 23. The half-tone mask 24 has an opaque region 241, a translucent region 242, and first, second and third transparent regions 243, 244, 245 alternating with the opaque and translucent regions 241, 242. Light irradiation is applied to the photoresist layer 23 through the half-tone mask 24, whereby a region of the photoresist layer 23 corresponding to the opaque region 241 receives substantially no light irradiation. A region of the photoresist layer 23 corresponding to the translucent region 242 receives substantially a half level of the light irradiation. Regions of the photoresist layer 23 corresponding to the first, second and third transparent regions 243, 244, 245 receive substantially a full level of the light irradiation.

Figure 7:
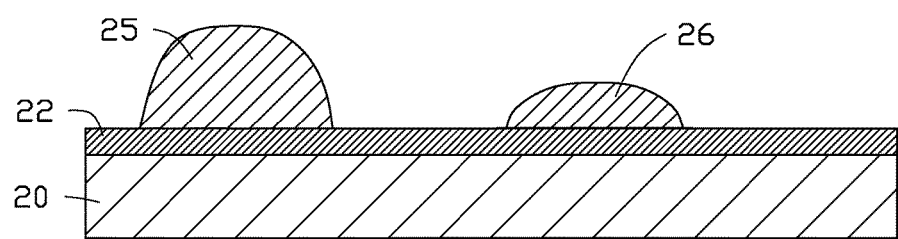
FIG. 7 is a cross-sectional view showing a structure obtained from the photolithographic process of FIG. 6.

Then the photoresist layer 23 is subjected to development. Referring to FIG. 7, after the development, the regions of the photoresist layer 23 corresponding to the first, second and third transparent regions 243, 244, 245 of the half-tone mask 24 are substantially totally removed. The region of the photoresist layer 23 corresponding to the opaque region 241 becomes a first photoresist 25. The region of the photoresist layer 23 corresponding to the translucent region 242 becomes a second photoresist 26. The first photoresist 24 has a size sufficiently larger than a size of the second photoresist 26. The first photoresist 25 has a height substantially double as a height of the second photoresist 26.

Figure 8:
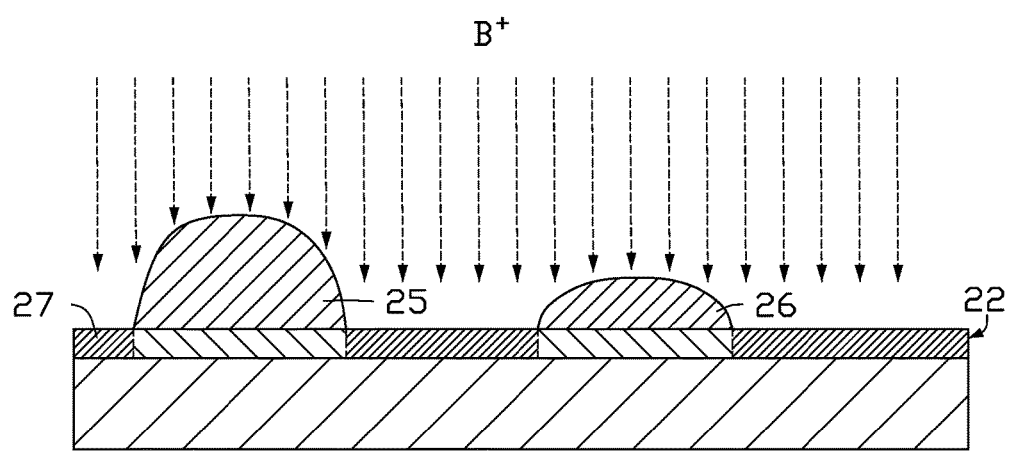
FIG. 8 is a cross-sectional view showing a first ion implantation process of the method of FIG. 5.

At block 304, also referring to FIG. 8, a first ion implantation is carried out by implanting boron ions $B^+$ into the poly-Si layer 22 whereby regions 27 of the poly-Si layer 22 not covered by the first and second photoresists 25, 26 are implanted with boron ions $B^+$ with a first concentration.

Figure 9:
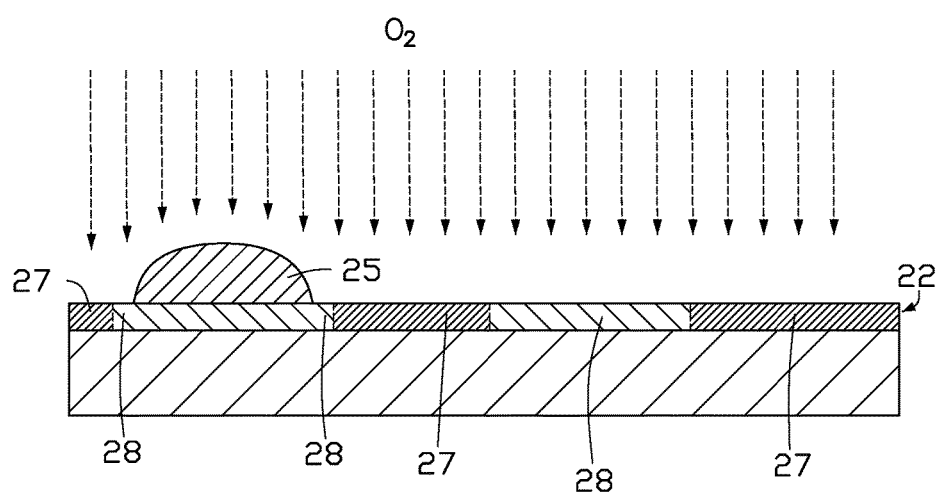
FIG. 9 is a cross-sectional view showing an ashing process of the method of FIG. 5.

At block 306, also referring to FIG. 9, thereafter an ashing process is performed by applying oxygen $O_2$ to the first and second photoresists 25, 26 (FIG. 8) and the poly-Si layer 22. By the ashing process, the second photoresist 26 is substantially totally removed to expose a region 28 of the poly-Si layer 22 thereunder. The first photoresist 25 is shrunk and partly removed to expose a region 28 of the poly-Si layer 22 under a peripheral portion of the original photoresist 25 of FIG. 8.

Figure 10:
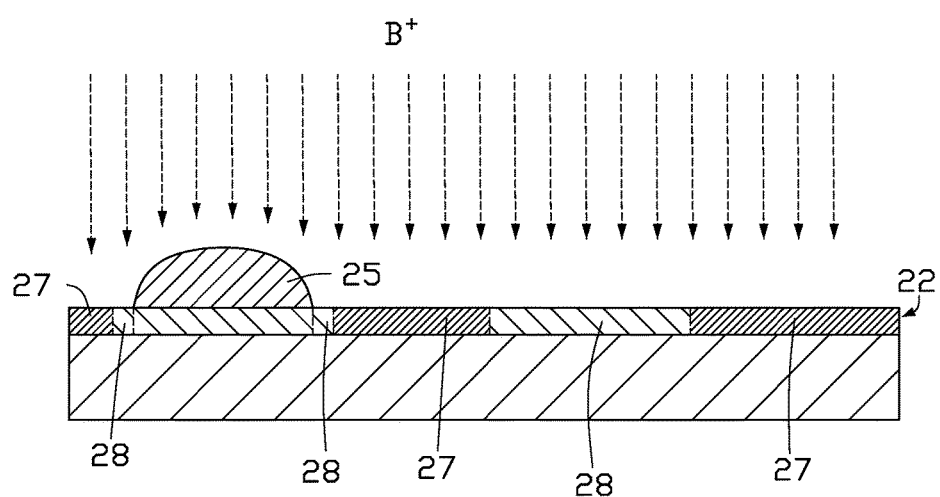
FIG. 10 is a cross-sectional view showing a second ion implantation process of the method of FIG. 5.

At block 308, also referring to FIG. 10, a second ion implantation process is applied to the poly-Si layer 22 by implanting boron ions $B^+$ to the poly-Si layer 22, whereby the ion concentration of the regions 27 is increased from the first concentration to a second concentration. The newly exposed regions 28 of the poly-Si layer 22 has a third ion concentration which is smaller than the second concentration.

Figure 11:
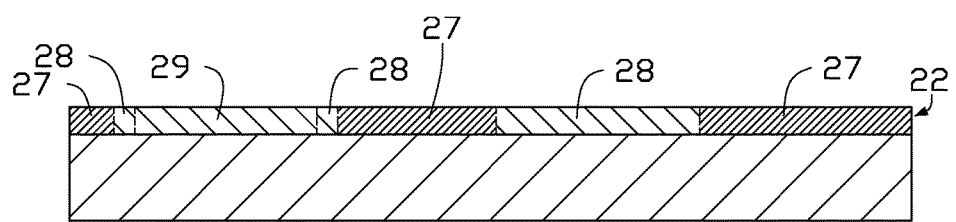
FIG. 11 is a cross-sectional view showing a photoresist stripping process of the method of FIG. 5.

At block 310, also referring to FIG. 11, a photoresist stripping process is performed to substantially totally remove the remained first photoresist 25 to expose a region 29 of the poly-Si layer 22 thereunder. The region 29 has no boron ion therein yet.

Figure 12:
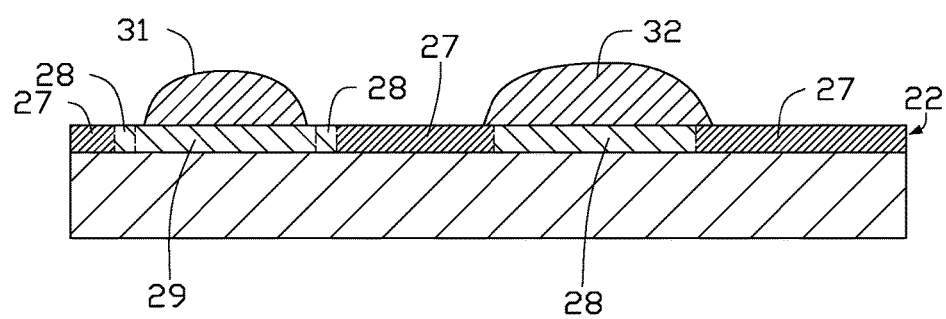
FIG. 12 is a cross-sectional view showing a poly-Si layer photolithographic process of the method of FIG. 5.

At block 312, also referring to FIG. 12, a photolithographic process is performed to form a third photoresist 31 over the region 29 of the poly-Si layer 22 and a fourth photoresist 32 over one of the regions 28 of the poly-Si layer 22 away from the region 29. The third and fourth photoresists 31, 32 are formed by firstly applying a photoresist layer on the poly-Si layer 22; then a light irradiation is applied to the photoresist layer through a full-tone mask; and finally the irradiated photoresist layer is developed to form the third and fourth photoresists 31, 32. The third photoresist 31 does not totally cover the region 29 but leaves a peripheral portion of the region 29 exposed. The fourth photoresist 32 totally covers its respective region 28 and parts of the regions 27 adjacent the respective region 28.

Figure 13:
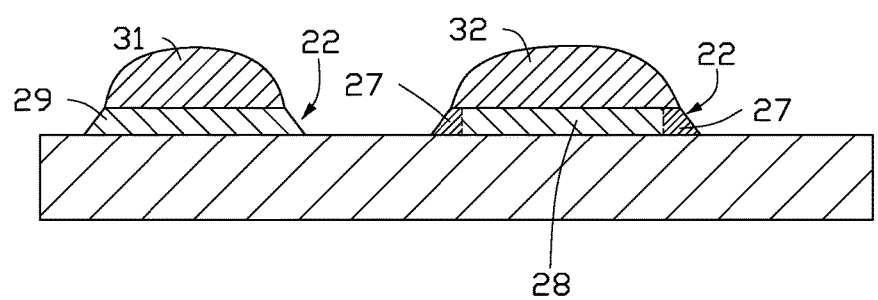
FIG. 13 is a cross-sectional view showing a poly-Si layer dry etching step of the method of FIG. 5.

At block 314, also referring to FIG. 13, a poly-Si dry etching process is preformed to remove parts of the poly-Si layer 22 not covered by the third and fourth photoresists 31, 32.

At block 316, a photoresist stripping process is performed to remove the third and fourth photoresist 31, 32 to expose the poly-Si layer 22 thereunder.

Figure 14:
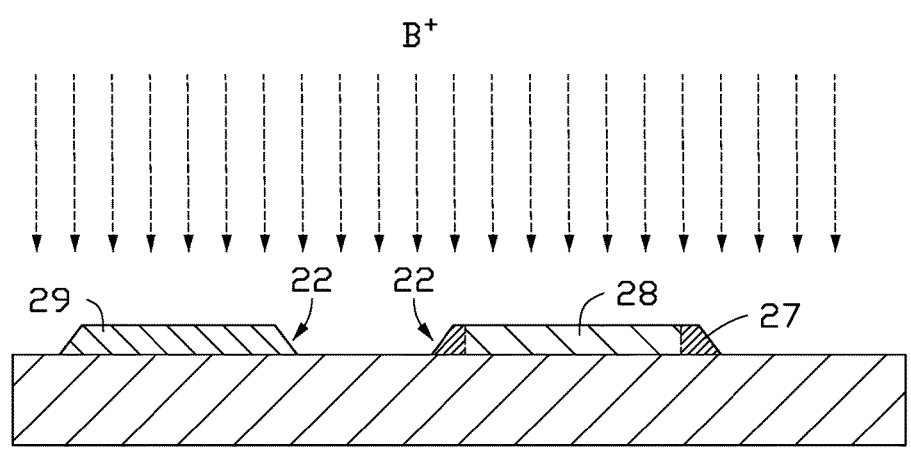
FIG. 14 is a cross-sectional view showing a third ion implantation process of the method of FIG. 5.

At block 318, also referring to FIG. 14, after the removal of the third and fourth photoresists 31, 32, the poly-Si layer 22 is subjected to a third boron ion implantation process. Boron ions $B^+$ are implanted into the regions 29, 27, 28 of the remained poly-Si layer 22. After the third ion implantation, referring back to FIG. 2, the region 29 becomes the first semiconductor layer 106 for the PMOS transistor unit 100, and the region 28 and its neighboring parts of the regions 27 together form the second semiconductor layer 206 for the NMOS transistor unit 200. During the third ion implantation process, the flat portions of the regions 29, 27 and the region 28 each receive a dosage of ions which is more than a dosage of ions received by each of tapered portions of the regions 29, 27. Thus, the concentrations of ions in the regions 114, 116, 118, 120, 122 of the first and second semiconductor layers 106, 206 of the CMOS device 1 of FIG. 2 which respectively are CP/e, CP/f, CN/e, CN/f-1, CN/f-2 have the following relationship: CP/e<CP/f<CN/f-2<CN/e<CN/f-1.

Also referring to FIG. 1, after block 318, the source and drain electrodes 102, 202, the gate insulator 112 and the gate electrode 108 (or the gate electrodes 109, 110 of FIG. 4) are formed to form the CMOS device 1 having the PMOS transistor unit 100 and the NMOS transistor unit 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in particular the matters of shape, size and arrangement of parts within the principles of the present disclosure, up to and including the full extent established by the broad general meaning of the terms used in the claims.

What is claimed is:

1. A method for making a complementary metal oxide semiconductor (CMOS) device comprising:
   providing a substrate, a semiconductor layer on the substrate and a photoresist layer on the semiconductor layer;
   irradiating the photoresist layer through a half-tone mask and developing the irradiated photoresist layer to obtain a first photoresist and a second photoresist having a height smaller than a height of the first photoresist;
   first implanting ions to the semiconductor layer;
   ashing the first and second photoresists to shrink the first photoresist to expose a first region of the semiconductor layer and remove the second photoresist to expose a second region of the semiconductor layer;
   secondly implanting ions to the semiconductor layer;
   removing the first photoresist to expose a third region of the semiconductor layer which is surrounded by the second region;
   forming a third photoresist and a fourth photoresist on the semiconductor layer through photolithography, wherein the third photoresist occupies a central portion of the third region and the second photoresist occupies the second region and a fourth region of the semiconductor layer around the second region;
   etching the semiconductor layer to remove the semiconductor layer not covered by the third and fourth photoresists;
   removing the third and fourth photoresists;
   thirdly implanting ions to the semiconductor layer to form a first semiconductor layer and a second semiconductor layer separated from the first semiconductor layer;
   forming first source and drain electrodes beside the first semiconductor layer for forming a p-channel metal oxide semiconductor (PMOS) transistor unit, and forming second source and drain electrodes beside the second semiconductor layer for forming an n-channel metal oxide semiconductor (NMOS) transistor unit; and
   forming at least a gate electrode over the first and second semiconductor layers for controlling operation of the PMOS and NMOS transistor units;
   wherein the first semiconductor layer comprises a first tapered region having an ion concentration of CP/e and a first flat region having an ion concentration of CP/f; the first tapered region is located at opposite sides of the first flat region; the second semiconductor layer has a second tapered region having an ion concentration of CN/e, a second flat region having an ion concentration of CN/f-2, and a third flat region having an ion concentration of CN/f-1; the second tapered region is located at opposite sides of the second flat region; and the third flat region is located between the second flat region and the second tapered region; wherein the ion concentrations have following relationship: CP/e<CP/f<CN/f-2<CN/e<CN/f-1.

2. The method of claim 1, wherein the semiconductor layer is made of polycrystalline silicon.

3. The method of claim 2, wherein the ions are boron ions.

4. The method of claim 1, further comprising forming a gate insulator electrically insulating the at least one gate electrode from the first and second semiconductor layers.

5. The method of claim 4, wherein the at least one gate electrode is located between the first source electrode and the first drain electrode.

6. The method of claim 5, wherein the at least one gate electrode is also located between the second source electrode and the second drain electrode.

7. The method claim 6, wherein the at least one gate electrode comprises a first gate electrode being located over the first semiconductor layer.

8. The method claim 7, wherein the at least one gate electrode comprises a second gate electrode being located over the second semiconductor layer.

9. The method of claim 1, wherein the etching is dry etching.

10. The method of claim 1, wherein the ashing is performing by blowing oxygen to the first and second photoresists.

* * * * *